(12) United States Patent
Wang

(10) Patent No.: US 6,487,076 B1
(45) Date of Patent: Nov. 26, 2002

(54) COMPACT HEAT SINK MODULE

(75) Inventor: Ru-Ching Wang, Taipei Hsien (TW)

(73) Assignee: Auras Technology, Ltd., Taipei Hsien (TW)

(*) Notice: Subject to any disclaimer, the term of this patent is extended or adjusted under 35 U.S.C. 154(b) by 0 days.

(21) Appl. No.: 09/968,081

(22) Filed: Oct. 1, 2001

(51) Int. Cl.[7] .............................................. H05K 7/20
(52) U.S. Cl. ...................... 361/697; 165/80.3; 361/687; 415/213.1
(58) Field of Search ................................ 415/177, 178, 415/213.1, 214.1; 454/184; 312/236; 257/722; 165/80.3, 104.33, 121–126; 174/16.1, 15.2; 361/687, 700, 703, 704–712, 695, 697, 717–719

(56) References Cited

U.S. PATENT DOCUMENTS

| | | | | |
|---|---|---|---|---|
| 5,339,214 A | * | 8/1994 | Nelson ........................ | 361/695 |
| 5,959,837 A | * | 9/1999 | Yu ............................... | 361/697 |
| 5,973,921 A | * | 10/1999 | Lin .............................. | 361/695 |
| 6,102,110 A | * | 8/2000 | Julien et al. | |
| 6,166,907 A | * | 12/2000 | Chien .......................... | 361/699 |
| 6,238,097 B1 | * | 5/2001 | Beyfuss et al. ............. | 384/572 |
| 6,282,089 B1 | * | 8/2001 | Nakanishi et al. | |

* cited by examiner

Primary Examiner—Gerald Tolin
(74) Attorney, Agent, or Firm—Thomas, Kayden, Horstemeyer & Risley, LLP

(57) ABSTRACT

A compact heat sink module is able to provide a compact heat sink for installation in a notebook computer. Furthermore the heat sink module has an effective cooling ability for keeping a normal operation temperature of a CPU by multiple conductors conducting heat from the CPU and a fan surrounded within the conductors.

8 Claims, 3 Drawing Sheets

COMPACT HEAT SINK MODULE

BACKGROUND OF THE INVENTION

1. Field of the Invention

The present invention relates to a compact heat sink module and more particularly to a heat sink module that is adapted to be retained on a CPU disposed in a thin notebook computer and that effectively carries heat away from the CPU.

2. Description of Related Art

The twin trends of faster computing speeds and size reduction of computers leads to a particular problem concerning effective heat dissipation from the central processor units of the computers. Usually a heat sink device having a plurality of fins and a fan is fitted to a CPU so that heat is rapidly evacuated from the interior of the computer and the CPU in particular. If that heat is not dispersed quickly the CPU will soon overheat and become defective thereby leading to considerable inconvenience and costs to the user. With the increasing popularity of laptop and notebook computers nowadays a problem arises in that there is insufficient space within these slim device to house an effective fin array and fan.

A significant drawback of current fin arrays is that the size thereof necessary to effectively disperse the heat is in fact too large for the casing of the computer. The flanges are necessarily large in order to effectively disperse the heat from the CPU.

To overcome the shortcomings, the present invention provides a compact and efficient heat sink module to mitigate and obviate the aforementioned problems.

SUMMARY OF THE INVENTION

The objective of the present invention is to provide a compact and effective heat sink module for installing in a notebook computer.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
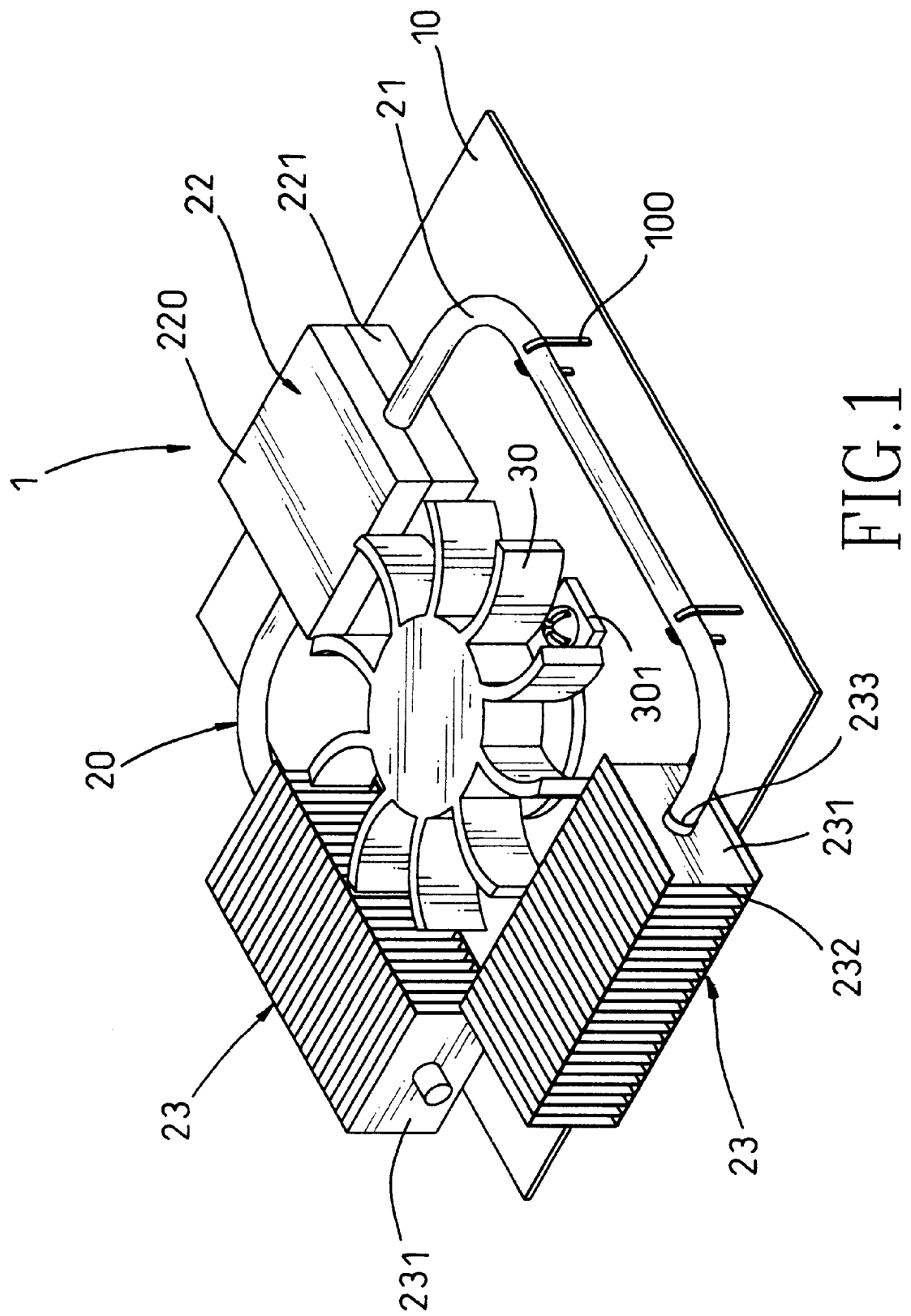
FIG. 1 is a perspective view of a first embodiment of the compact heat sink module in accordance with the present invention.

With reference to FIG. 1, a first embodiment of a compact heat sink module (1) is shown. The heat sink module (1) connected separably on a CPU (not shown) includes a base (10), and a body (20) connected on the base (10) for connecting separably. A plurality of tongs (100) corresponding to the body (20) are formed on a top surface of the base (10) to fix the body (20) of the heat sink module (1) on the base (10).

The body (20) comprises an assembling device (21) fixed on the base (10) by attachment with the tongs (100), a conducting block (22) connected to the assembling device (20) for separably connecting to the CPU (not shown), at least one conductor (23) connected to the assembling device (21) for conducting heat from conducting block (22), and a fan (30) mounted to a center position of the base (10). The assembling device (21) is formed as a metal frame with two ends close to each other for connecting with the conductors (23) and the conducting block (22). The electric fan (30) is surrounded by the conductors (23) and the conducting block (22). The conducting block (22) includes an upper portion (220) and a lower portion (221) separable from the upper portion (220) whereby the conducting block (22) is able to be easily mounted on the assembling device (21). Each conductor (23) comprises a plurality of conducting plates (231) stacked together. Each conducting plate (231) is U shaped, and when stacked together a gap (232) is defined between the adjacent conducting plates (231) to easily disperse heat from the conductor (23). A through hole (233) is defined in the center of each conducting plate (231) whereby the assembling device (21) can extend through the conductors (23). At least one connector (301) is formed on a bottom of the fan (30) to secure the fan (30) to the base (10).

Figure 2:
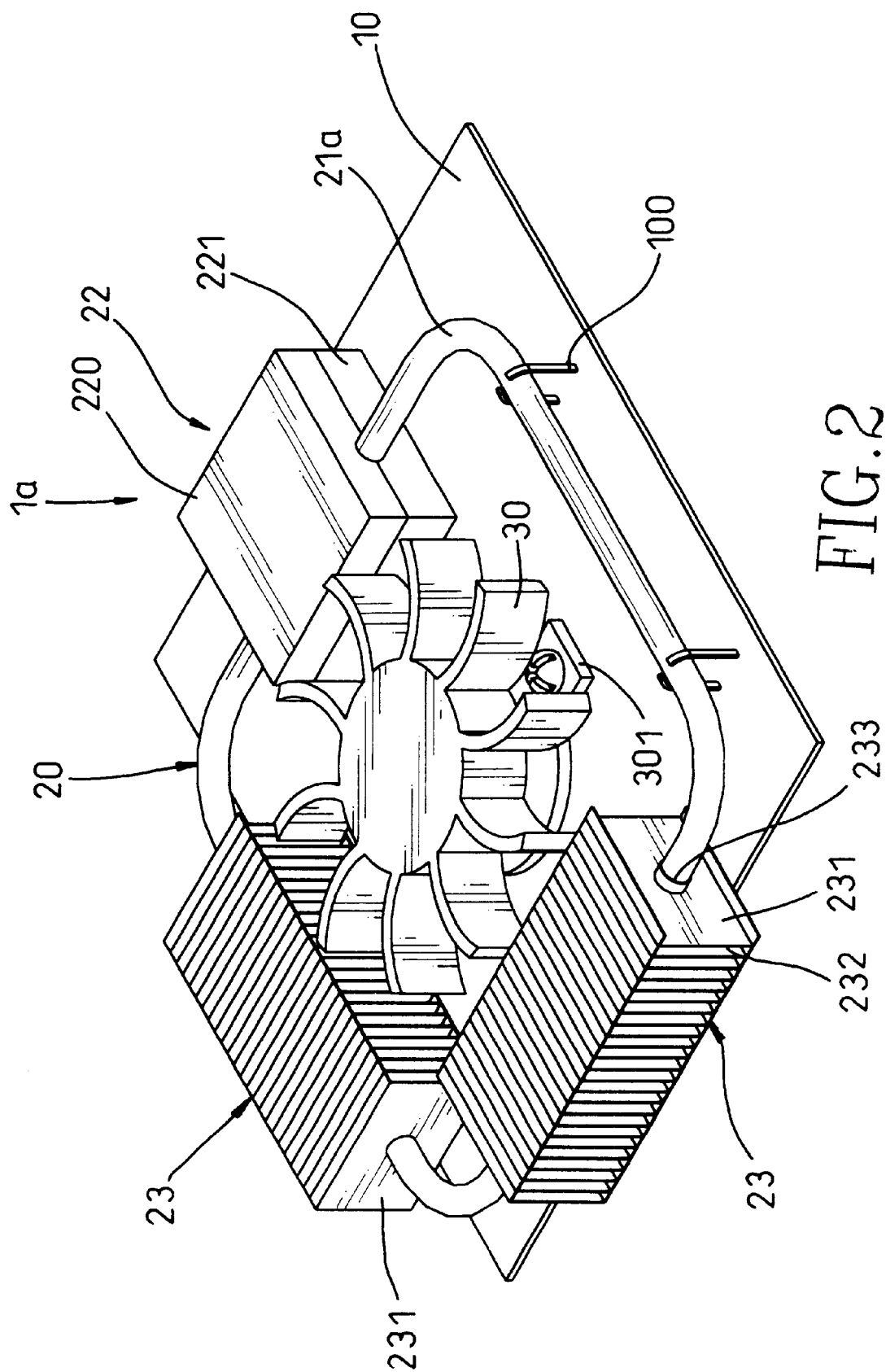
FIG. 2 is a perspective view of a second embodiment of the compact heat sink module in accordance with the present invention.

Referring to FIG. 2, a second embodiment of the heat sink module (1a) is shown wherein the difference between the assembling device (21) of the first embodiment and an assembling device (21a) of the second embodiment is that the assembling device (21a) is complete metal ring.

Figure 4:
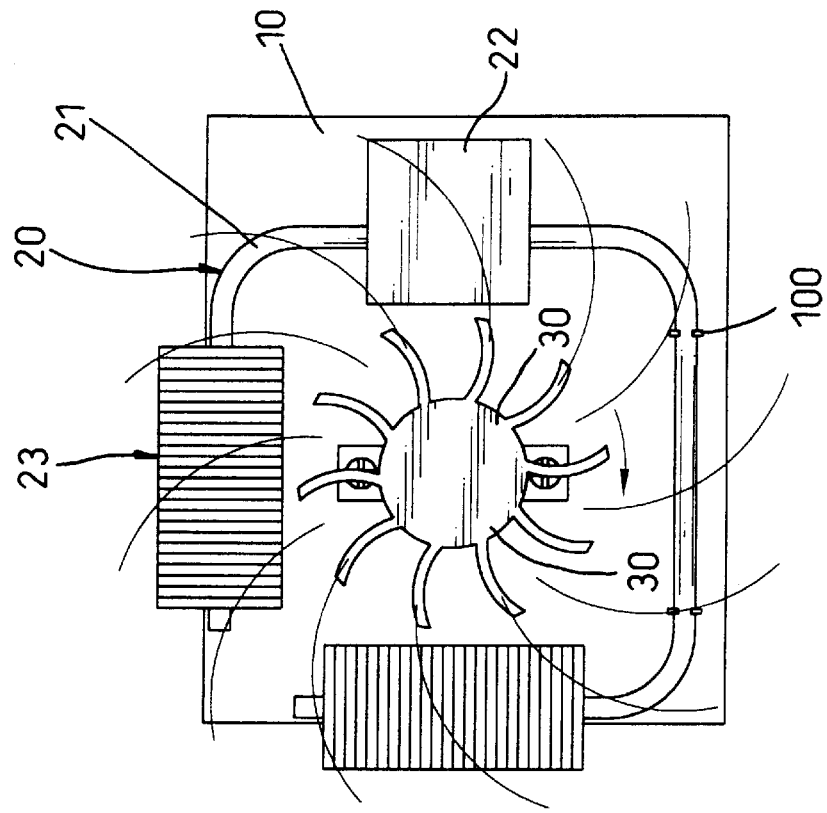
FIG. 4 is a schematic view of the first embodiment of the compact heat sink module in accordance with the present invention.
Figure 3:
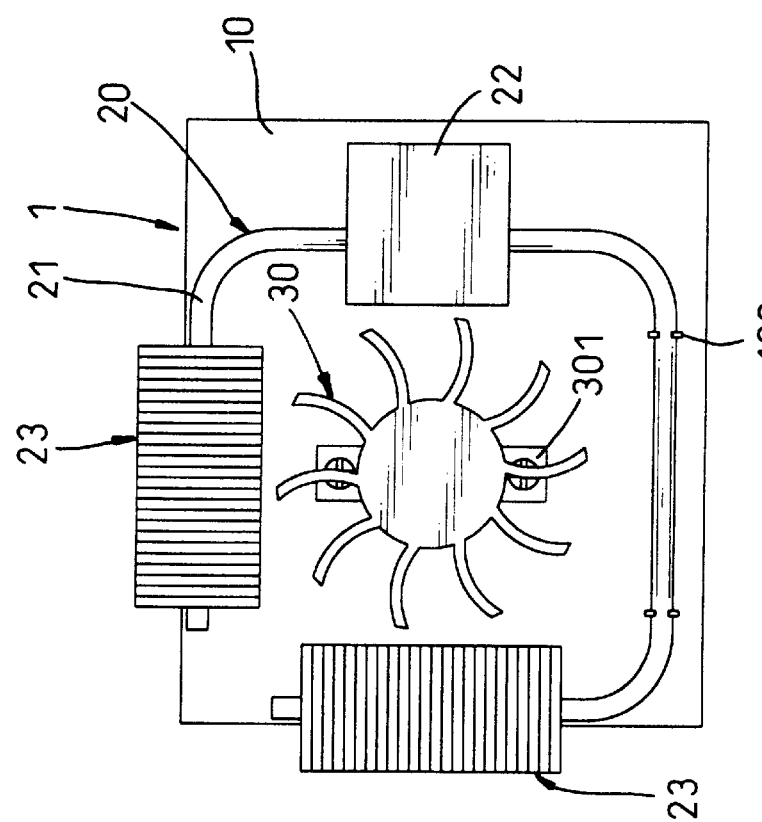
FIG. 3 is a top view of the first embodiment of the compact heat sink module in accordance with the present invention.

With reference to FIG. 3, a top view of the first embodiment of the heat sink module (1) is shown. A surface of the upper portion (220) connects to a CPU (not shown) for dissipating heat from the CPU, and then the heat from the conducting block (22) is conducted through the assembler device (21) to each conductor (23). As the fan (30) is surrounded by the assembling device (21), when the fan (30) operates air is sequentially drawn from an exterior of a computer casing in which the CPU is housed, through the conductors (23) and around the conductor block (22), and thus each conductor (23) carries heat from conducting block (22) away. More particularly, the plurality of gaps (232) define a broad heat exchange space of the conductor (23) and an standing arrangement of the gaps is in accordance with a direction of a vortex caused by the fan (30), as shown FIG. 4.

As per the above description, the assembled elements of the heat sink are particularly compact and of a low profile so that the heat sink module is suitable for installation in a notebook computer.

Although the present invention has been explained in relation to its preferred embodiment, it is to be understood that many other possible modifications and variations can be made without departing from the spirit and scope of the invention as hereinafter claimed.

What is claimed is:

1. A compact heat sink module adapted for use with a CPU, the compact heat sink module comprising:
   a body separately connected on a base for connection to the CPU to carry heat from the CPU away, wherein the body comprises:
   at least one assembling device connected on a surface of the base;
   a conducting block connected to the at least one assembling device for connecting to the CPU;
   at least one conductor connected to the at least one assembling device for dispersing heat from the conducting block, and a plurality of gaps defined in at least one conductor; and a fan mounted to the base and retained within the at least one assembling device and the conducting block, wherein the fan has a heat exchange function with the at least one conductor and the conducting block, whereby heat generated by the CPU is effectively dispersed by the heat sink module.

2. The compact heat sink module as claimed in claim 1, wherein the at least one conductor comprises a plurality of U-shapes conducting plates stacked together, each of the gaps being respectively defined between adjacent conducting plates.

3. The compact heat sink module as claimed in claim 1, wherein at least one fixed connector is formed on a bottom of the fan for securing the fan to the base.

4. The compact heat sink module as claimed in claim 1, wherein multiple fixed supports are formed on the base for fixing the assembling devices on the base.

5. The compact heat sink module as claimed in claim 4, wherein the multiple fixed supports are tongs.

6. The compact heat sink module as claimed in claim 1, wherein the conducting block has an upper portion and lower portion for combination of the conducting block on the at least one assembling device.

7. The compact heat sink module as claimed in claim 1, wherein the at least one assembling device is a ring shape.

8. The compact heat sink module as claimed in claim 1, wherein the at least one assembling device is a frame with two ends close to each other.

* * * * *